United States Patent
Wakabayashi

[11] Patent Number: 5,904,519
[45] Date of Patent: May 18, 1999

[54] METHOD OF MANUFACTURING BI-CMOS

[75] Inventor: Masaru Wakabayashi, Tokyo, Japan

[73] Assignee: NEC Corporation, Tokyo, Japan

[21] Appl. No.: 08/879,320

[22] Filed: Jun. 19, 1997

[30] Foreign Application Priority Data

Jun. 20, 1996 [JP] Japan ................................. 8-160108

[51] Int. Cl.⁶ ............................................. H01L 21/8238
[52] U.S. Cl. ......................... 438/202; 438/234; 257/378; 148/DIG. 9
[58] Field of Search ................................. 438/787, 234, 438/202, 203, 204, 205; 148/DIG. 9, DIG. 116, DIG. 117, DIG. 118; 257/378

[56] References Cited

FOREIGN PATENT DOCUMENTS

| 60-49646 | 3/1985 | Japan . |
|---|---|---|
| 63-36555 | 2/1988 | Japan . |
| 3-68167 | 3/1991 | Japan . |
| 6-52778 | 6/1994 | Japan . |
| 7-176638 | 7/1995 | Japan . |

OTHER PUBLICATIONS

"Semiconductor Devices—Basic Theory And Process Technology", published by Sangyo Tosho, May 25, 1987 pp. 356–369.

Primary Examiner—Charles Bowers
Assistant Examiner—Scott J. Hawranek
Attorney, Agent, or Firm—Whitham, Curtis & Whitham

[57] ABSTRACT

A method of manufacturing a semiconductor device made up of a Bi-CMOS integrated circuit with the performance of MOS and bipolar elements enhanced. A semiconductor substrate surface is selectively oxidized to divide surface into a bipolar element forming area and a MOS element forming area. Next, the entire substrate surface is oxidized to form an oxide film 9, after which high-density ions are implanted into a collector leading area. Then, driving-in of the collector leading area is performed by performing heat treatment in an oxidizing atmosphere while forming an oxide film 9b on the collector leading area and another oxide film 9a on the MOS element forming area. Subsequently, the oxide film is etched all over the semiconductor substrate surface by the thickness of the oxide film 9a to expose the semiconductor substrate surface of the MOS element forming area. Lastly, the substrate surface is entirely oxidized to form a gate insulation film thinner than the oxide film 9.

14 Claims, 8 Drawing Sheets

METHOD OF MANUFACTURING BI-CMOS

BACKGROUND OF THE INVENTION

1. Field of the Invention

The present invention relates to a method of manufacturing a semiconductor device made up of a Bi-CMOS (Complementary Metal Oxide Semiconductor) integrated circuit composed of a bipolar element and a MOS (Metal Oxide Semiconductor) element in a mixed manner.

2. Description of the Related Art

Generally, the Bi-CMOS requires to fabricate bipolar elements, which are vertically arranged elements, and CMOS elements, which are horizontally arranged element, on a same substrate. This, however, makes the fabrication process complicated and therefore increases the number of fabrication steps.

To overcome this problem, a method was proposed in which, for example, the LDD (Lightly Doped Drain) of a MOS element and the base of a bipolar element are formed at the same time in addition to the well and isolation region-common to these elements such that the advantages of both the elements are preserved, thereby forming the bipolar elements in as small number of fabrication steps as possible by matching the fabrication process to the standard CMOS element forming process.

One example of this will be described with reference to the technology disclosed in Japanese Non-examined Patent Publication No. Hei 6-52778.

The following describes the related-art method of manufacturing a semiconductor device made up of a Bi-CMOS integrated circuit with reference to FIGS. 13 through 19.

Figure 13:
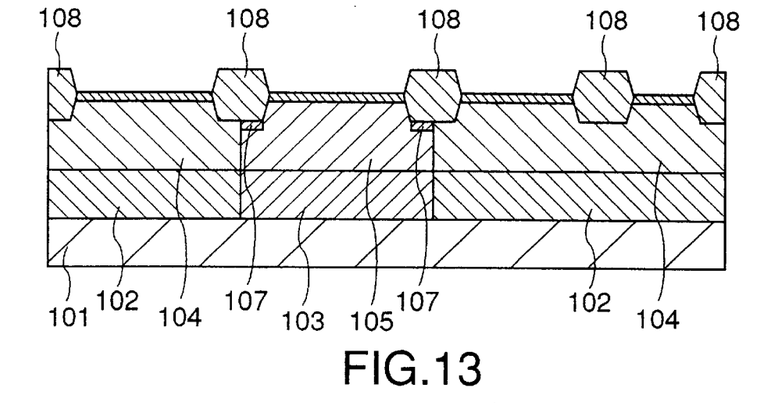
FIGS. 13 through 19 are a sectional view illustrating a semiconductor device manufacturing method associated with a related-art technology in the order of manufacturing steps.

Now, referring to FIG. 13, a p-type silicon substrate 101 is formed with an $n^+$ buried layer 102 and a $p^+$ buried layer 103, on which an n-type epitaxial layer 104 is formed. Next, a p-type well 105 is formed in an n-channel MOS area and an isolation area. Then, by selective oxidization, a p-type channel stopper 107 and a field oxide film 108 are formed.

Figure 14:
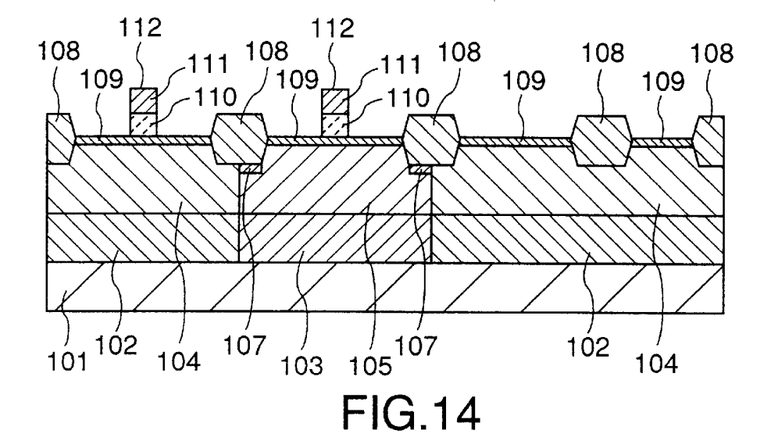

Referring to FIG. 14, an element forming area is exposed, on which an oxide film 109 as a gate insulation film is grown by thermal oxidization. Then, a polycrystalline silicon layer 110 is grown all over the oxide film 109 by CVD (Chemical Vapor Deposition), all over which a WSi (Tungsten Silicide) layer 111 is grown by sputtering. Next, patterning is performed and an gate electrode 112 of the MOS element is formed.

Figure 15:
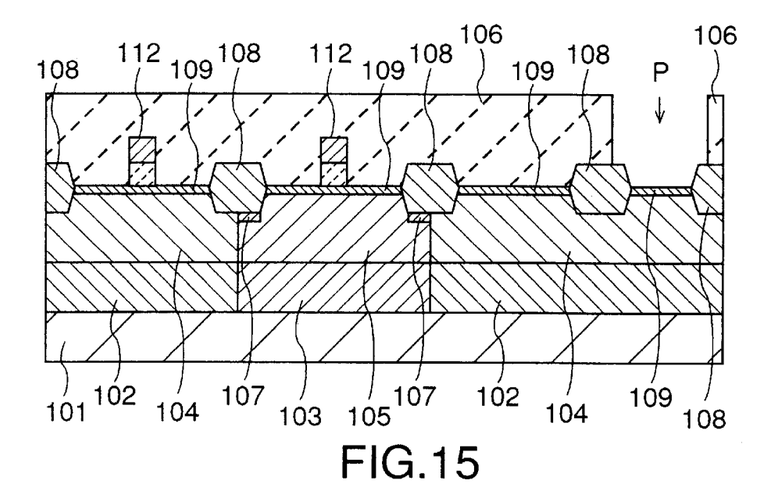

Referring to FIG. 15, with a photo resist 106 used as a mask, an impurity such as phosphorus is ion-implanted into a collector leading area of the bipolar element.

Figure 16:
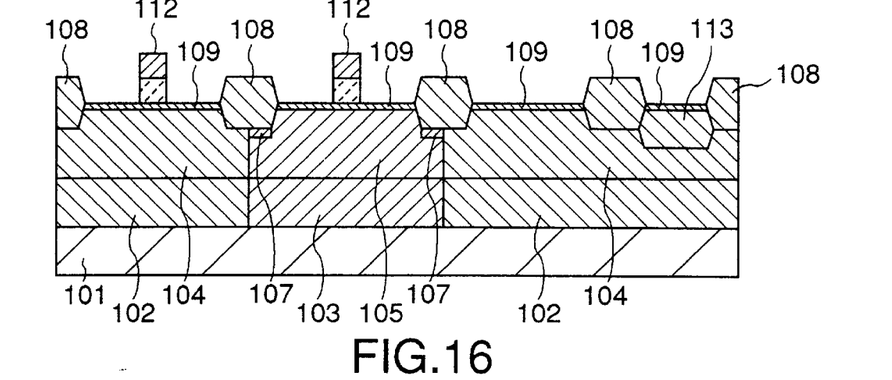

Referring to FIG. 16, the ion-implanted impurity is diffused by the thermal treatment in nitrogen atmosphere to form an $n^+$ diffusion layer 113.

Figure 17:
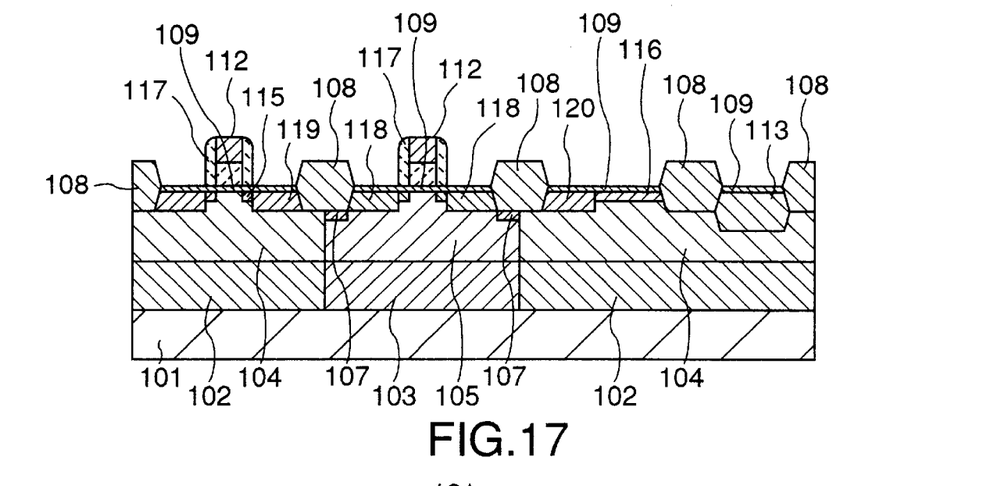

Referring to FIG. 17, with a photo resist used as a mask, an $n^-$ diffusion layer 114 that provides the LDD of an n-channel MOS element and an $p^-$ diffusion layer 115 that provides the LDD of a p-channel MOS element are formed in a self aligning manner. At this moment, a $p^-$ diffusion layer 116 as an intrinsic base of the bipolar element is also formed. Next, an oxide film is grown on all over the surface, then an sidewall oxide film 117 is formed on the side of the gate electrode 112 by reactive ion etching. Then, with a photo resist used as a mask, an $n^+$ diffusion layer 118 that provides the source and drain of the n-channel MOS element and a $p^+$ diffusion layer 119 that provides the source and drain of the p-channel MOS element are formed by ion-implantation in a self aligning manner. At this moment, a $p^+$ diffusion layer 120 as a external base of the bipolar element is also formed.

Figure 18:
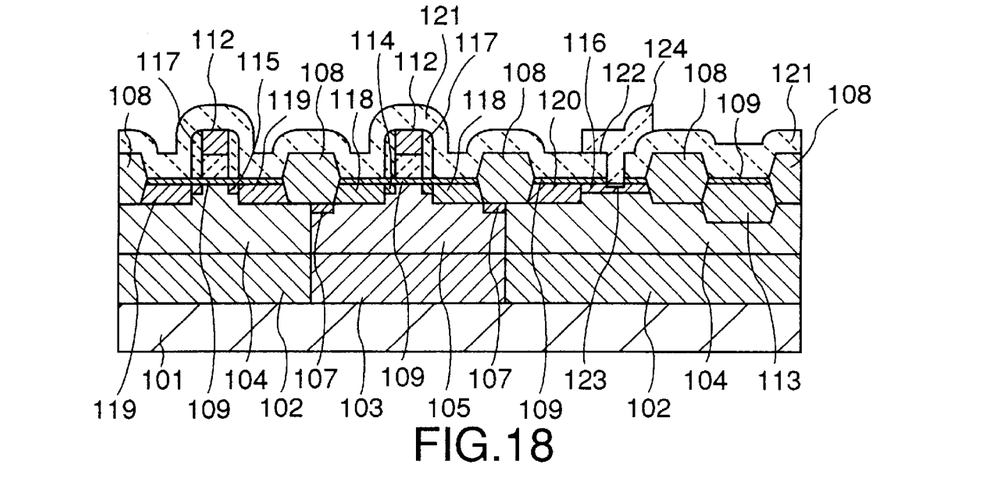

Referring to FIG. 18, after growing an oxide film 121 on all over the surface by CVD, selective etching is performed to form a window 122 over the intrinsic $p^-$ diffusion base layer 116. Next, a polycrystalline silicon layer is formed on the all over surface by CVD, then an impurity such as arsenic is ion-implanted into the polycrystalline, and thermal treatment is performed.

At this moment, due to diffusion of the impurity from the polycrystalline silicon layer, an $n^+$ diffusion layer 123 that provides a shallow emitter is formed on the $p^-$ diffusion layer 116. Then, patterning is performed to form an emitter electrode 124.

Figure 19:
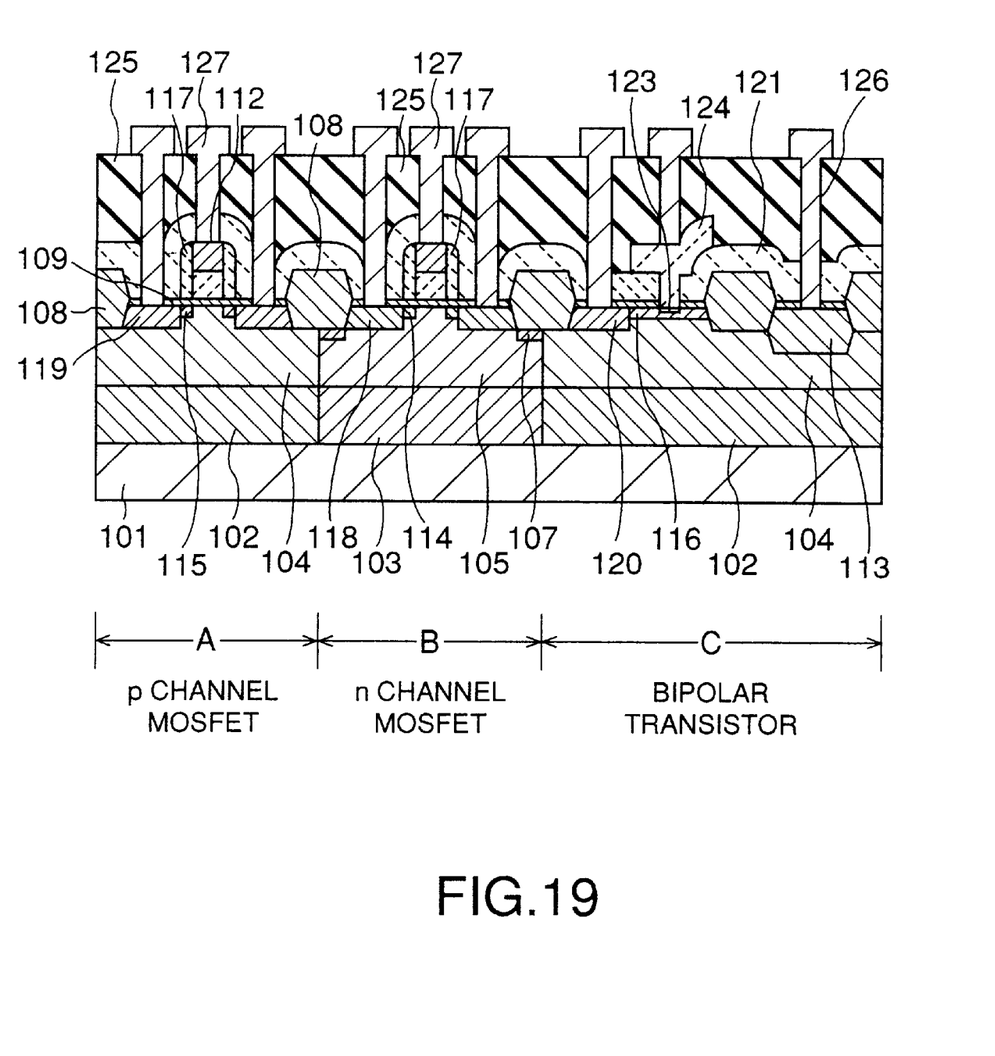

Referring to FIG. 19, after growing an interlayer insulation film 125 on the main surface, selective etching is performed on the interlayer insulation film 125 to form a contact window 126. Finally, an aluminum layer is formed on the main surface by sputtering and then patterning is performed to form an aluminum electrode 127, completing the Bi-CMOS integrated circuit.

The above-mentioned semiconductor device manufacturing method simplifies the manufacturing process by forming the bipolar element and the MOS element on the same semiconductor substrate as the small number of manufacturing steps as possible.

Conventionally, after forming of the gate insulation film and the gate electrode, phosphorus is implanted into the collector leading area and impurity drive-in step by heat treatment is performed. This is done to prevent as far as possible the ion implantation through the insulation film 109 from causing crystalline defect on the substrate surface and the implanted phosphorus from being diffused out into the gas atmosphere.

However, in the conventional manufacturing method, implanting high-density phosphorus and performing impurity diffusion at high temperatures to further lower the resistance of the collector leading area of the bipolar element hinder the increase in the operation speed and integration of the MOS element.

To be more specific, when high-density phosphorus is implanted into the collector leading area, the oxide film 109 needs to be comparatively thick to prevent crystalline defect from occurring on the substrate surface. However, in the conventional technology, this oxide film and the oxide film that provides the gate insulation film of the MOS element are formed in a same step, thereby making the gate insulation film as thick as the oxide film 109. Consequently, only a dose as small as about $5 \times 10^{15}$ atoms/cm$^2$ can be ion-implanted into the area that provides the collector leading area. This prevents the collector leading area of relatively low resistance from being realized.

SUMMARY OF THE INVENTION

It is therefore an object of the present invention to provide a method of manufacturing a semiconductor device made up of a high-performance, high-integrated, and highly reliable Bi-CMOS integrated circuit that enhances both the characteristics and performance of the bipolar element and the MOS element at the same time.

In carrying out the invention and according to one aspect thereof, there is provided a semiconductor device manufacturing method comprising the steps of: dividing a semiconductor substrate surface into a bipolar element forming area and a metal oxide semiconductor element forming area;

forming an oxide film on the semiconductor substrate surfaces of the bipolar element forming area and the MOS element forming area; defining a collector leading area by implanting impurity ions into the bipolar element forming area at a predetermined position via the oxide film; performing oxidization for growing the oxide film on the semiconductor substrate surface; etching the oxide film until the semiconductor substrate surface of the MOS element forming area is exposed; and forming a gate oxide film on the MOS element forming area by oxidizing the semiconductor substrate surface.

As described above, since the gate insulation film of the MOS element is formed again after forming the collector leading area, the thickness of the oxide film at forming the collector leading area and the thickness of the gate insulation film can be set independently. Consequently, it is possible to perform a high-density impurity implantation into the substrate without the occurrence of the crystalline defect in the substrate because the thickness of the oxide film of the collector leading area is able to be thick when high density phosphorus ions are inplanted into the substrate through the oxide film.

Further, since the oxide film is left on the collector leading area when the oxide film on the area providing the MOS element is removed, the implanted phosphorus is prevented from diffusing out from the surface of the collector leading area at the oxidizing process to form the gate oxide film. Thus, the impurity in the collector leading area can be maintained at a high density. Moreover, since the impurity diffused out from the substrate will not reenter the gate oxide film of the MOS element, the durability of the gate oxide film can be enhanced.

Still further, the above-mentioned novel constitution allows the semiconductor device according to the invention to be manufactured at a yield higher than that in the related-art technology without adding any other photo resist masks.

The above and other objects, features and advantages of the present invention will become more apparent from the accompanying drawings, in which like reference numerals are used to identify the same or similar parts in several views.

DETAILED DESCRIPTION OF THE PREFERRED EMBODIMENTS

This invention will be described in further detail by way of example with reference to the accompanying drawings.

Figure 1:
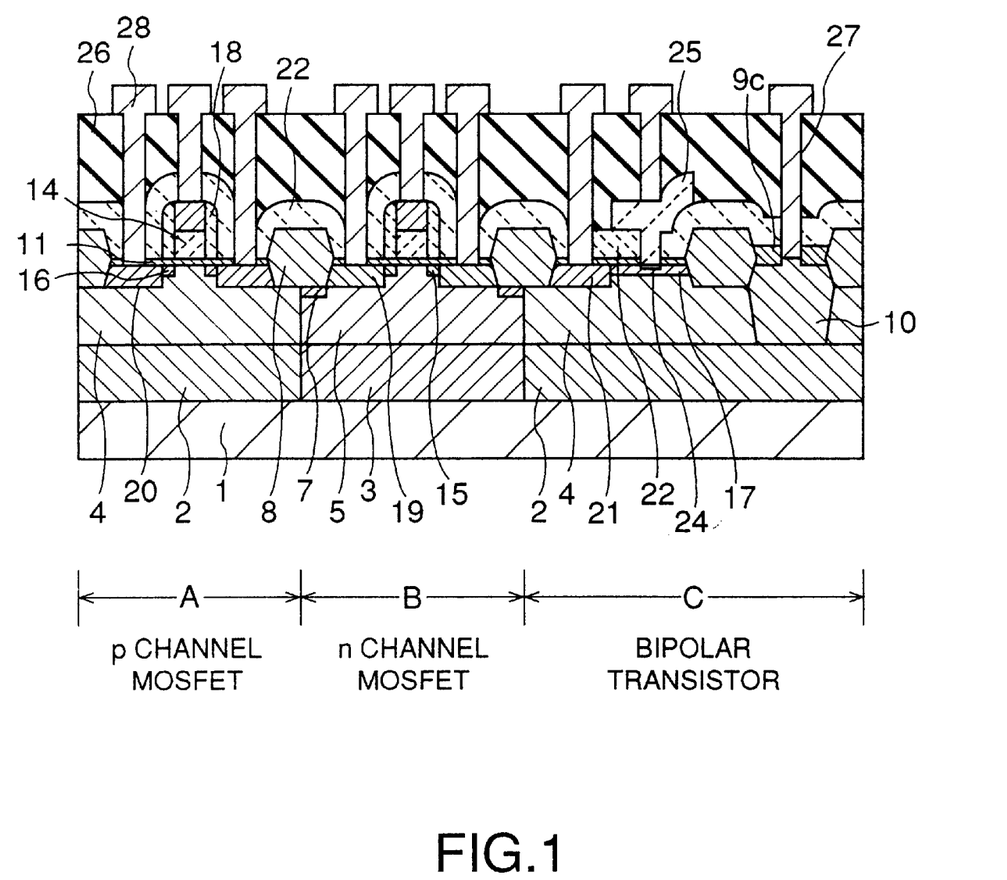
FIG. 1 is a sectional view illustrating a bipolar element and a MOS element of a semiconductor device manufactured by a semiconductor device manufacturing method practiced as a first preferred embodiment of the present invention.

Now, referring to FIG. 1, there is shown a sectional view illustrating a construction of a semiconductor device manufactured by a semiconductor device manufacturing method practiced as a first preferred embodiment of the present invention. FIGS. 2 through 11 illustrate the manufacturing method of the first preferred embodiment in the order of manufacturing steps.

Figure 2:
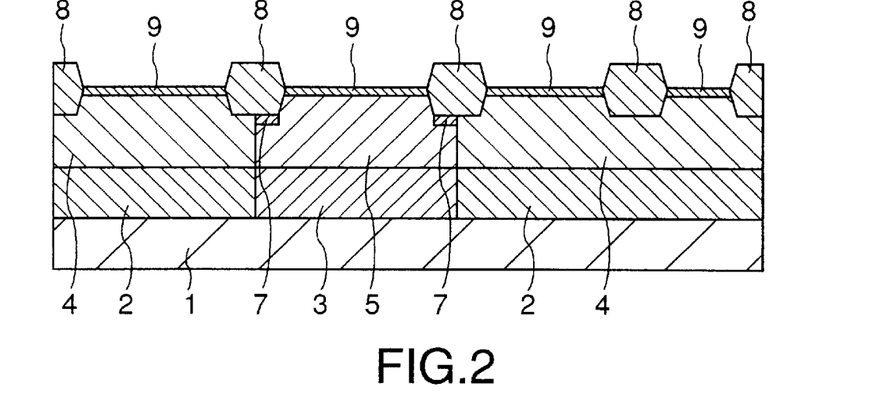
FIGS. 2 through 11 are sectional views illustrating the semiconductor manufacturing method associated with the first preferred embodiment of the present invention in the order of manufacturing steps.

Referring to FIG. 2, a p-type silicon substrate 1 is formed with an $n^+$ buried layer 2 and a $p^+$ buried layer 3, on which an n-type epitaxial layer 4 is grown to a thickness of 1.0 to 3.0 micrometers, thereby forming a p-type well 5 in an n-channel MOS area and an isolation area. Next, a p-type channel stopper 7 and a field oxidation film (LOCOS) 8 are formed thereon. The process so far is generally the same as that of a related-art semiconductor device manufacturing method.

Then, after the main surface of an element forming area is exposed, an oxide film 9 is grown to a thickness of 20 to 30 nanometers in an oxygen atmosphere at 900 to 1000 degrees centigrade.

Figure 3:
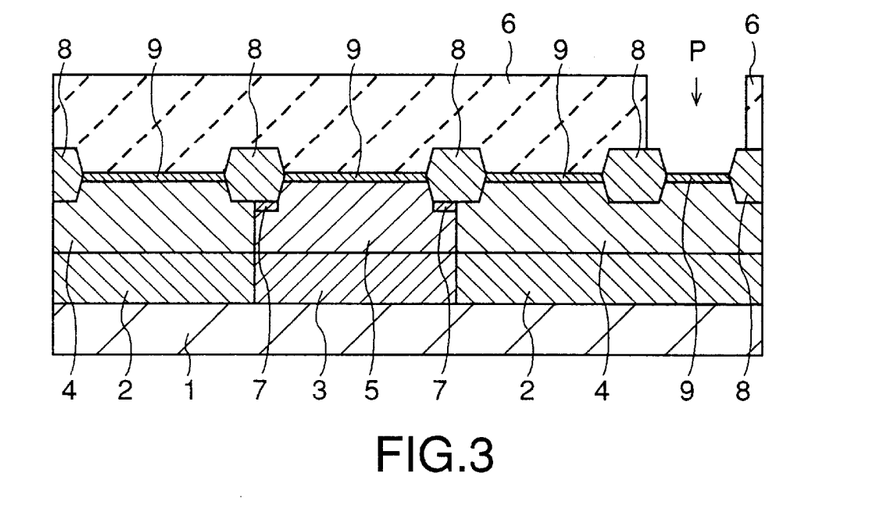

Referring to FIG. 3, using a photo resist 6 as a mask, phosphorus is implanted in an amount of 1 to $2\times10^{16}$ $cm^{-2}$ into an area that provides collector leading area of a bipolar element.

Figure 4:
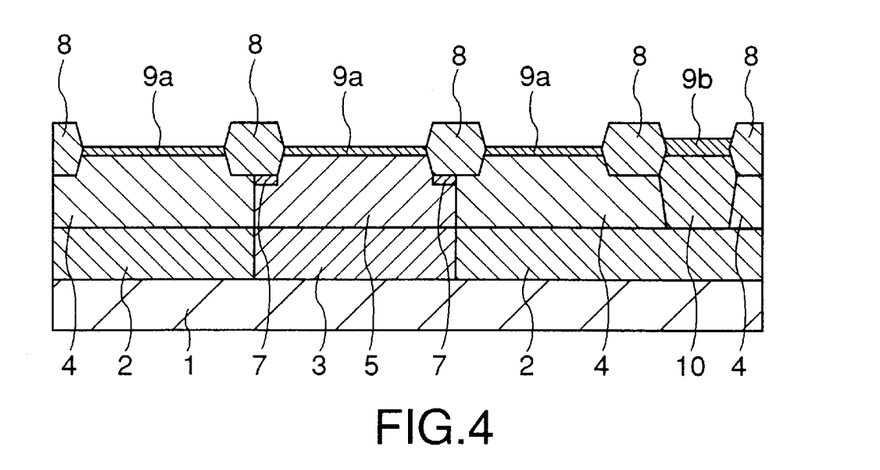

Referring to FIG. 4, after the photo resist 6 is removed, thermal treatment is performed in a steam atmosphere at 900 to 980 degrees centigrade to form an $n^+$ diffusion layer 10 so that the ion-implanted impurity is diffused to reach the $n^+$ buried layer 2. At the same time, the oxide film 9 on the surface of the semiconductor substrate grows further, so that the oxide film on the element forming area except the collector leading area 10 grows to a thickness of 40 to 50 nanometers (9a), while the oxide film 9 on the collector leading area 10 grows further to a thickness of 100 to 120 nanometers (9b). This is because that the oxidizing speed is increased in the steam atmosphere more than in nitrogen or oxygen atmosphere, moreover the oxidizing speed is considerably increased by the high-density impurity doped in the silicon substrate. This phenomenon is described in "Semiconductor Devices—Basic Theory And Process Technology," published by Sangyo Tosho, pp. 356 through 369, (first published on May 25, 1987), by way of example.

According to the above-mentioned document, when the phosphorus density exceeds $1\times10^{20}$ $cm^{-3}$, the oxidizing speed comes to have density dependency. Therefore, the surface of the collector leading area is set at an impurity density of $1\times10^{20}$ to $1\times10^{21}$ $cm^{-3}$ and other element areas such as a well surface of the MOS element for example is set at an impurity density of $1\times10^{16}$ to $1\times10^{17}$ $cm^{-3}$.

In the above-mentioned oxidizing process, the relatively thick oxide films 9a and 9b are formed on the element forming area, so that no density change on the substrate surface due to phosphorus out-diffusion takes place.

Figure 5:
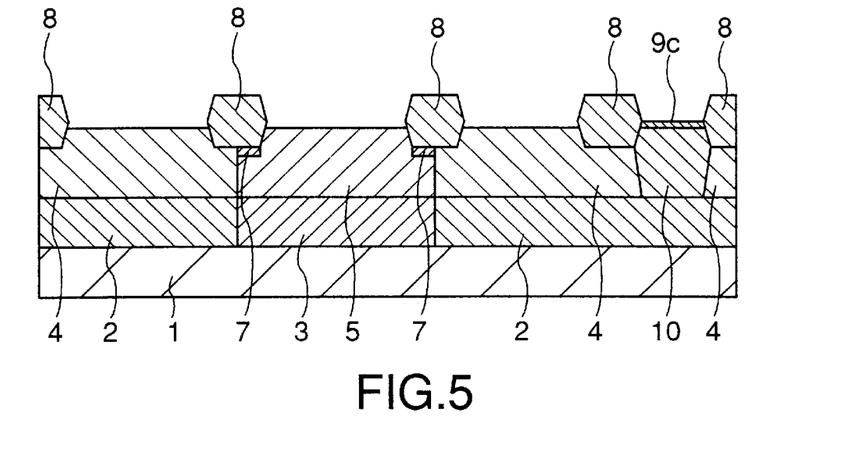

Referring to FIG. 5, the oxide film is removed all over the surface by the thickness of the oxide film 9a by wet etching. On the collector leading area, the oxide film is left to a thickness of 60 to 70 nanometers (resulting in an oxide film 9c), thereby exposing the other substrate surfaces on the element forming area.

Figure 6:
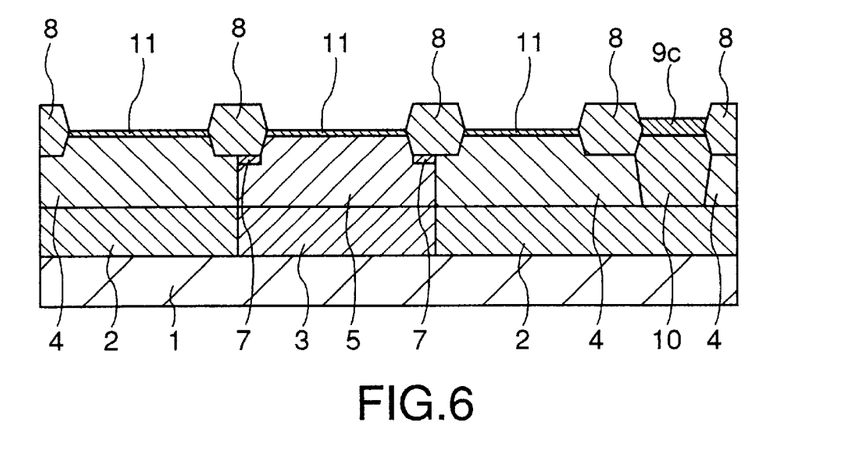

Referring to FIG. 6, oxidization is performed in a steam atmosphere at 750 to 850 degrees centigrade to grow an oxide film 11 as a gate insulation film to a thickness of 10 to 15 nanometers. The gate oxide film is formed again after the ion-implantation of phosphorus into the collector leading area and driven therein, thus the thickness of the oxide film 11 can be reduced. Moreover, since the oxide film 9c already exists on the element area in this oxidizing process, no density change on the substrate surface due to phosphorus out-diffusion takes place.

Figure 7:
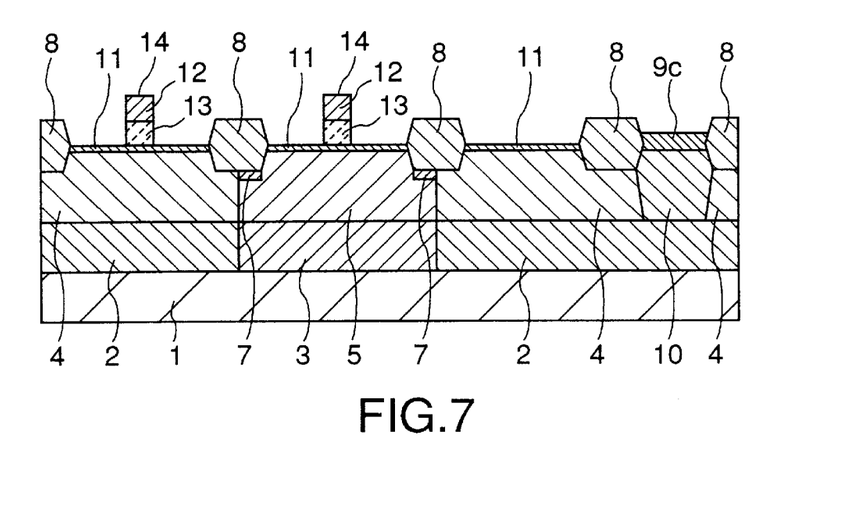

Referring to FIG. 7, a polycrystalline silicon layer 13 is grown by CVD on the oxide film 11 to a thickness of 100 to 200 nanometers and a WSi layer 12 is grown by sputtering to a thickness of 100 to 200 nanometers on all over the surface in this order. Then, after pattering, a gate electrode 14 of the MOS element is formed.

Figure 8:
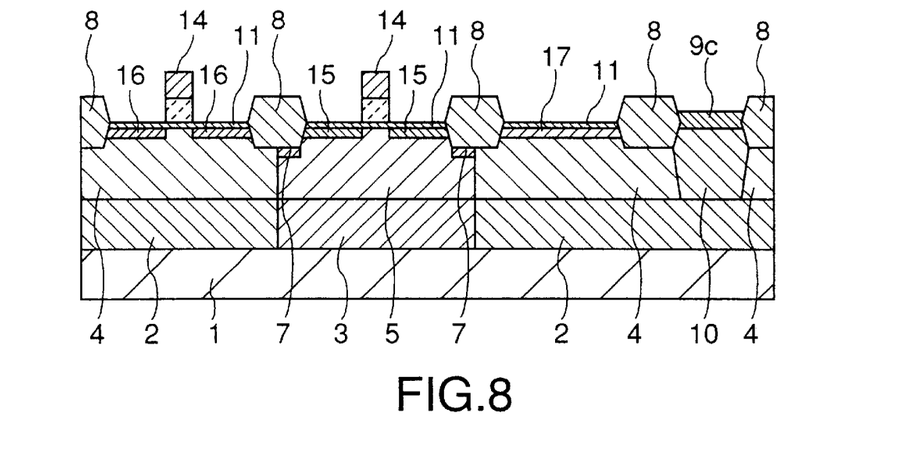

Referring to FIG. 8, using a photo resist as a mask, an n$^-$ diffusion layer 15 that provides the LDD of an n-channel MOS element and a p diffusion layer 16 that provides the LDD of an p-channel MOS element are formed by a self aligning manner to the gate electrode 14 as the same manner as the related-art semiconductor device manufacturing method. At the same time, a p$^-$ diffusion layer 17 as an intrinsic base of the bipolar element is also formed.

Figure 9:
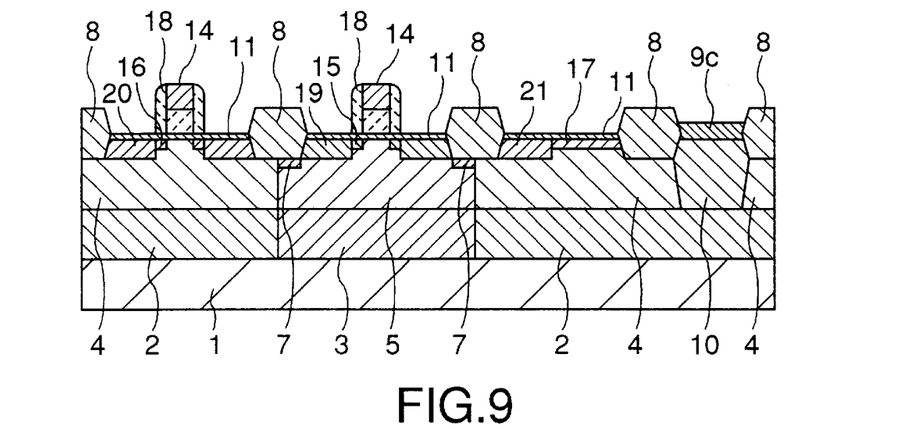

Referring to FIG. 9, after growing an oxide film to a thickness of 200 to 300 nanometers on the main surface, the formed oxide film is removed by reactive ion etching to form an sidewall oxide film 18 having a thickness of 200 to 300 nanometers on the side of the gate electrode 14. Then, using a photo resist as a mask, an n$^+$ diffusion layer 19 for the source and drain of the n-channel MOS element and a p$^+$ diffusion layer 20 for the source and drain of the p-channel MOS element are formed by ion-implantation step in a self aligning manner using the gate electrode and the sidewall oxidation film 18 as masks. At this time, a p$^+$ diffusion layer 21 for an external base of the bipolar element is also formed.

Figure 10:
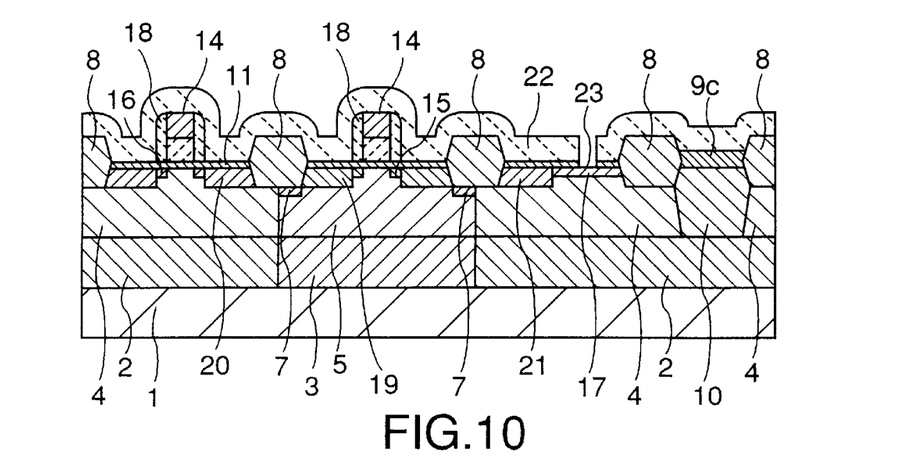

Referring to FIG. 10, an oxide film 22 is formed to a thickness of 200 to 300 nanometers on all over the main surface by CVD and the formed oxide film is selectively etched to form an window 23 having a width of 0.6 to 1.0 micrometer over the p$^-$ diffusion layer 17.

Figure 11:
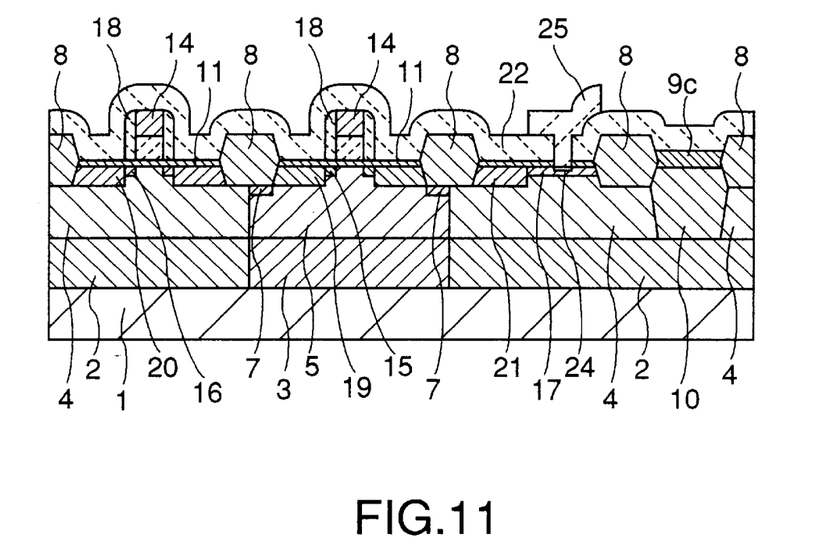

Referring to FIG. 11, a polycrystalline silicon layer is formed to a thickness of 200 to 300 nanometers by CVD on all over the main surface, then an n-type impurity such as arsenic is ion-implanted therein, and heat treatment is performed thereon. As a result, an n$^+$ diffusion layer 24 that provides a shallow emitter is formed on the p$^-$ diffusion layer 17 by the diffusion of the impurity from the polycrystalline silicon layer.

Then, the polycrystalline silicon is patterned to form an emitter electrode 25.

Next, an interlayer insulation film 26 is grown on all over the main surface. Then, the interlayer insulation film 26 is selectively etched to form a contact window 27.

Finally, an aluminum layer is formed on all over the main surface by sputtering. The aluminum layer is then patterned to form an aluminum electrode 28. Thus, the semiconductor device shown in FIG. 1 is completed.

As a second preferred embodiment of the present invention, in the process shown in FIG. 4, the n$^+$ diffusion layer 10 may be formed by performing oxidization in a steam atmosphere at 900 to 980 degrees centigrade after performing drive-in process in a nitrogen atmosphere at 1000 to 1100 degrees centigrade.

Figure 12:
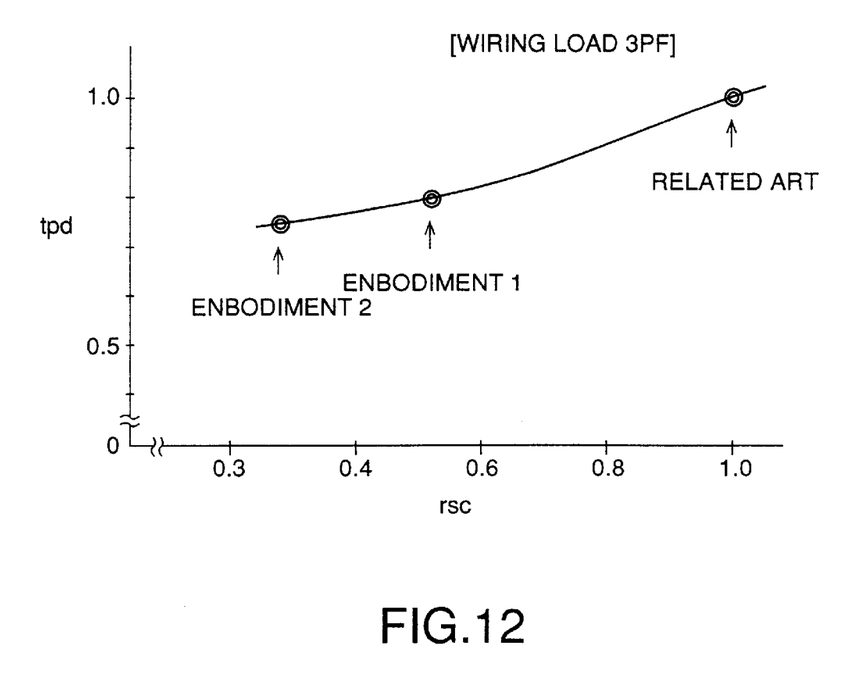
FIG. 12 is a diagram illustrating a relationship between the delay time and the collector resistance of an inverter composed of a Bi-NMOS circuit formed by the first preferred embodiment and a second preferred embodiment of the present invention.

According to the first preferred embodiment of the invention, because the gate insulation film is formed again by removing the previously grown oxide film on the MOS element area after performing the ion-implantation into the collector leading area and the thermal treatment thereon, it is possible to make the oxide film 9 thicker than the gate insulation film 11. Consequently, the dosage of ion implantation into the collector leading area can be increased as compared with the related-art technology. Further, in the heat treatment for forming the gate insulation film 11, the oxide film 9c already exists on the collector leading area so that prevents out-diffusion of the phosphorus from the collector leading area during the gate insulation film oxidizing process. Therefore, the collector leading area having a lower resistance than that of the related-art technology can be formed. This decreases the rsc (collector saturation resistance) shown in FIG. 12 by 50% to 60% as compared with that of the related-art technology.

The above-mentioned novel constitution therefore enhances the performance of the bipolar element; to be more specific, a delay time of an inverter made up of a Bi-MOS circuit can be reduced by 15% to 20%.

Further, since the oxide film forming process for forming the collector leading area is separated from the process of forming the gate insulation film of the MOS element, the thickness of the MOS gate insulation film can be set without restriction regardless of the bipolar element process. This novel constitution allows the MOS element to be scaled without restriction. For example, a high-speed MOS element having a gate length of 0.35 micrometers and a gate insulation film of 8 nanometers can be realized in the Bi-CMOS integrated circuit.

Still further, the novel constitution requires no additional photo resist mask, so that the semiconductor device associated with the present invention can be manufactured at a yield substantially higher than that in the related-art technology, involving no increase in the production cost.

According to the second preferred embodiment of the present invention, the n$^+$ diffusion layer that provides the collector leading area can be formed at relatively high temperatures exceeding 1000 degrees centigrade. Therefore, the rsc can be further reduced by 20% to 30% from that of the first preferred embodiment. This in turn further enhances the performance of the bipolar element, thereby further reducing the delay of the inverter made up of the Bi-NMOS circuit by 8%. Thus, the second preferred embodiment provides the advantages greater than those of the first preferred embodiment.

As described and according to the present invention, the performance of the bipolar element and the MOS element can be enhanced even if these elements are reduced in size and the semiconductor layer made up of the high-speed, high integration Bi-CMOS integrated circuit can be provided.

While the preferred embodiments of the present invention have been described using specific terms, such description is for illustrative purposes only, and it is to be understood that changes and variations may be made without departing from the spirit or scope of the appended claims.

What is claimed is:

1. A semiconductor device manufacturing method of manufacturing a bipolar element and a metal oxide semiconductor element on one semiconductor substrate, comprising the steps of:

dividing a surface of said semiconductor substrate into a bipolar element forming area in which said bipolar element is formed and a metal oxide semiconductor forming area in which said metal oxide semiconductor transistor element is formed;

forming a first insulation film on surfaces of said bipolar element forming area and said metal oxide semiconductor element forming area;

ion-implanting an impurity into said bipolar element forming area at a predetermined position via said first insulation film;

forming a second insulation film on the surface of said bipolar element forming area and a third insulation film on the surface of said metal oxide semiconductor element by growing a thickness of said first insulation film;

exposing a semiconductor substrate surface of said metal oxide semiconductor element forming area by removing said third insulation film; and forming a gate insulation film on said metal oxide semiconductor element forming area.

2. The semiconductor device manufacturing method as claimed in claim 1, wherein said first insulation film and said gate insulation film are both silicon oxide films, said gate insulation film being thinner than said first insulation film.

3. The semiconductor device manufacturing method as claimed in claim 2, wherein said predetermined position is a collector leading area.

4. The semiconductor device manufacturing method as claimed in claim 3, wherein a thickness of said first insulation film is grown by steam oxidization.

5. The semiconductor device manufacturing method as claimed in claim 4, wherein an impurity density in the area of said predetermined position is higher than an impurity density of said semiconductor substrate of said bipolar element forming area and said metal oxide semiconductor element forming area.

6. The semiconductor device manufacturing method as claimed in claim 5, wherein, before said steam oxidization, said impurity is pushed by heat treatment in a non-oxidizing atmosphere at a temperature higher than a temperature of said steam oxidization.

7. The semiconductor device manufacturing method as claimed in claim 4, wherein an oxidizing speed of said predetermined position is higher than an oxidizing speed of said semiconductor substrate surface of said bipolar element forming area and said metal oxide semiconductor element forming area.

8. The semiconductor device manufacturing method as claimed in claim 6, wherein, before said steam oxidization, said impurity is pushed by heat treatment in a non-oxidizing atmosphere at a temperature higher than that of said steam oxidization.

9. A semiconductor device manufacturing method comprising the steps of:

dividing a semiconductor substrate surface by selective oxidization into a bipolar element forming area and a metal oxide semiconductor element forming area;

forming, as a first oxidizing process, a first oxide film on semiconductor substrate surfaces of said bipolar element forming area and a metal oxide semiconductor element forming area;

defining a collector leading area by implanting impurity ions into said bipolar element forming area at a predetermined position via said first oxide film;

forming, as a second oxidizing process, a second oxide film by growing said first oxide film on said semiconductor substrate surface;

etching said second oxide film until exposing the semiconductor substrate surface of said metal oxide semiconductor element forming area; and forming, as a third oxidizing process, a gate oxide film on said metal oxide semiconductor element forming area by oxidizing all of said semiconductor substrate surface.

10. The semiconductor device manufacturing method as claimed in claim 9, wherein said first oxide film is thicker than said gate oxide film.

11. The semiconductor device manufacturing method as claimed in claim 10, wherein a dose of said impurity ions is set such that an oxidizing speed of said collector leading area is higher than an oxidizing speed of the surface of said metal oxide semiconductor element forming area.

12. A semiconductor device manufacturing method as claimed in claim 11, wherein said second oxidizing process is steam oxidization.

13. The semiconductor device manufacturing method as claimed in claim 12, wherein, before said second oxidizing process, said impurity ions are pushed by heat treatment in a non-oxidizing atmosphere at a temperature higher than a temperature of said second oxidizing process.

14. A semiconductor device manufacturing method as claimed in claim 13, wherein said impurity ions are phosphorus.

* * * * *